United States Patent [19]

Tricoles et al.

[11] 4,201,987
[45] May 6, 1980

[54] METHOD FOR DETERMINING ANTENNA NEAR-FIELDS FROM MEASUREMENTS ON A SPHERICAL SURFACE

[75] Inventors: Gus P. Tricoles, San Diego; Eugene L. Rope, El Cajon, both of Calif.

[73] Assignee: The United States of America as represented by the Secretary of the Navy, Washington, D.C.

[21] Appl. No.: 883,430

[22] Filed: Mar. 3, 1978

[51] Int. Cl.² .................................... G01R 29/10
[52] U.S. Cl. ............................. 343/703; 455/67
[58] Field of Search ............. 343/703, 17.7, 100 R, 343/765; 325/67, 363

[56] References Cited

PUBLICATIONS

Bates & Napier; Proceedings I.R.E.E. Australia, vol. 32, No. 4, Apr. 1971, pp. 164–166.
Test Procedure for Antennas; IEEE No. 149, Jan. 1965; pp. 8–17.
Jull, Estimation of Aerial Radiation Patterns from Limited Near-Field Measurements, IEE vol. 110, No. 3, pp. 501–506 (1963).
Bennett et al.; Microwave Holographic Metrology of Large Reflector Antennas, AP-24, No. 3, May 1976, pp. 295–303.

*Primary Examiner*—Eli Lieberman
*Attorney, Agent, or Firm*—R. S. Sciascia; G. J. Rubens; T. M. Phillips

[57] ABSTRACT

A method for determining antenna near-fields from measurements on a spherical surface. Phase and intensity values are measured by scanning a probe antenna over a spherical surface. The method applies both to planar or conformal antennas. The spherical surface may be in the Fresnel or Fraunhofer regions. The field at the antenna is computed utilizing the complex conjugate of the measured field. As a result, the source antenna at the point at which the antenna radiating field is evaluated is inside the measurement surface. Far-field patterns can be computed from the near-fields reconstructed from the spherical hologram surface.

4 Claims, 13 Drawing Figures

METHOD FOR DETERMINING ANTENNA NEAR-FIELDS FROM MEASUREMENTS ON A SPHERICAL SURFACE

BACKGROUND OF THE INVENTION

The present invention relates to methods of determining the operating characteristics of antennas and more particularly to determining near-fields more accurately than prior known techniques. Measurement techniques have been developed to obtain near-field data for use in computing far-field patterns. The procedure in the past was to measure the phase and intensity over a planar surface. For conformal arrays and antennas in radomes, these planar techniques are not sufficiently accurate because of the nonuniform reception by the probe. For conformal arrays, it is desirable to understand diffractions by the edges of a structure containing an array. For antennas and radomes, the field near the antenna is needed to facilitate pattern calculations; that is, practical calculations with ray tracing as surface integration require the near-field inside the radome without a field extending outside.

SUMMARY OF THE INVENTION

The present invention provides for a novel method of determining the field near the radiating antenna, which may be planar or conformal. Phase and intensity values are measured by scanning a probe antenna over a spherical surface. The surface may be in Fresnel or Fraunhofer regions. The surface should be large enough to reduce antenna interactions but small enough to reduce reflections from the surroundings. Using these data, the near-field is reconstructed using the formula $$u_i{}^* = \int \left( u_h{}^* \frac{\partial g}{\partial n} - g \frac{\partial u_h{}^*}{\partial n} \right) dS, \quad (1)$$

The spectrum of the reconstructed near-field is calculated by Fourier transformation. The spectrum is then modified by the filter function $[1+(1-\nu^2)]^{\pm\frac{1}{2}}$. By analytic continuation, the accuracy was further improved. Inverse Fourier transformation gives the enhanced near-fields from which far-field patterns may be computed.

The disclosed method is flexible. It applies to a wide class of antennas, including planar and conformal arrays, horns, reflectors, and wire antennas. For example, it can treat conformal arrays of arbitrary shapes. It is not restricted to shapes, such as a cone, for which the vector equation is separable. This flexibility arises because the measurement eliminates the solution of the boundary value problem for radiation and because the near-field can be computed at an arbitrary location.

OBJECT OF THE PRESENT INVENTION

An object of the present invention is the provision of the method of determining near-fields by making computations from measurements and utilize the complex conjugate of the measured field to provide a holographic image of the radiating source.

Other objects and many of the attendant advantages of this invention will be readily appreciated as the same becomes better understood by reference to the following detailed description when considered in connection with the accompanying drawings.

DETAILED DESCRIPTION

Figure 13:
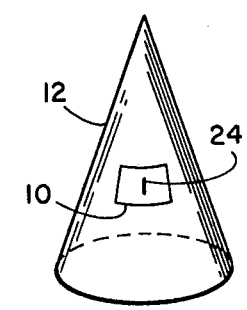
FIG. 13 shows the cone of FIG. 1 rotated 90° in a clockwise direction.

The first step of the method for determining near-fields involves making measurements of intensity and phase. The measurements are made with the apparatus shown in FIG. 1. The test antenna, for which near-fields are being determined, is a slot array 10 in a cone 12. FIG. 13 shows cone 12 rotated 90°. Cone 12 is mounted on a base 14 supported on a turntable 16. A probe antenna 18 is coupled to a waveguide section 20 by means of an adjustable coupling 19. This allows probe 18 to be positioned to always point to the antenna slot 24. Waveguide 20 is movably mounted on vertical member 21 which is attached to a movable base 19.

Phase and intensity data are recorded while antenna 10 is rotated so that the cone side Z having antenna slot 24 will generate a cylinder of radius R'c with the probe 18 in a fixed position. Another set of data is recorded after the probe 18 is moved to a point on an arc of a circle 17 that lies in a vertical plane and is centered near the tested antenna 10. This procedure is repeated by moving waveguide 20 vertically as indicated by arrow 22 by means of a rack 23 and spur gear, not shown, keeping probe 18 always pointing at the antenna slot 24 until data is measured on a set of circles which are horizontal sections of a sphere centered near the antenna 10. To ensure R is constant with each movement of waveguide 20, base 19 is also moved in the required direction. The phase and intensity data may be measured by any suitable commercially available device 25 coupled to waveguide 20 such as a microwave bridge or the Hewlitt Packard microwave network analyzer 18410 S, and the microwave field and be produced by a microwave signal generator 27. The measured values are processed in a general purpose computer 29 which may be of the Control Data Cyber 70 type.

Figure 1:
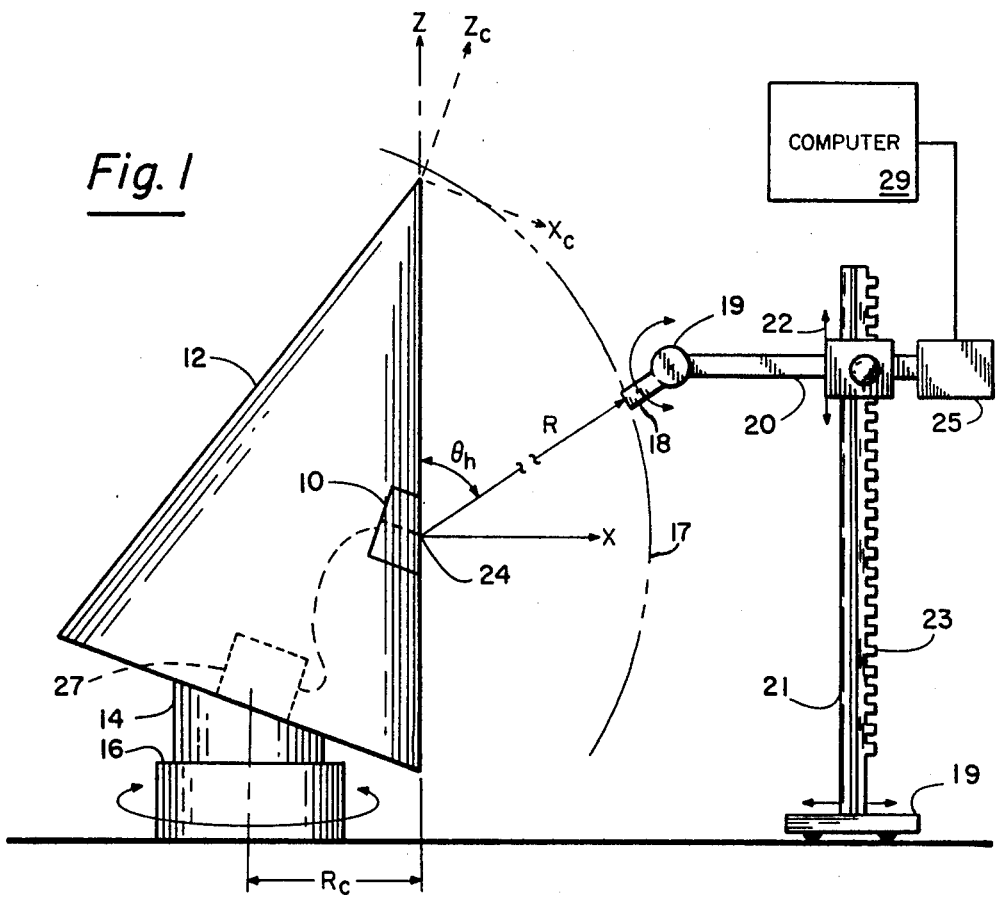
FIG. 1 shows the apparatus for making measurements.
Figure 2:
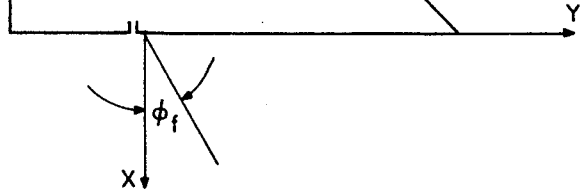
FIG. 2 is a plan view of a slot antenna in a conical surface.

FIG. 2 depicts the coordinates and configuration of the cone of FIG. 1. The angle $\phi_f$ is a far-field angle. The $\phi_h$ (FIG. 1) is measured from the Z-axis, perpendicular to the surface of the drawing.

By way of example, and as shown in FIG. 1, phase and intensity were measured with a small horn 18 with 2.5 by 2.0 cm aperture on paths of radius 24λ$_o$, with the slot near the center of curvature. Frequency was 9.400 GHz. Equation (1) is numerically evaluated to produce or reconstruct, the magnetic and electric fields near the antenna. These calculations are based on the Helmholtz formula and Maue's boundary condition as described in Journal Optical Society Am, 60 p. 1051 (1970). For the complex conjugate of a rectangular component of the electric or magnetic field intensity the equation $$u_i{}^* = \int \left( u_h{}^* \frac{\partial g}{\partial n} - g \frac{\partial u_h{}^*}{\partial n} \right) dS,$$

is used where * denotes conjugation, and subscripts i and h denote image and hologram respectively. The Green's function, g, is $p^{-1}$ exp(ikp), with $i=\sqrt{-1}$, k is $2\pi/\lambda_o$ where $\lambda_o$ is free space wavelength, and p is distance between integration and observation points. The normal derivative is denoted by $\partial f/\partial n$.

Figure 3:
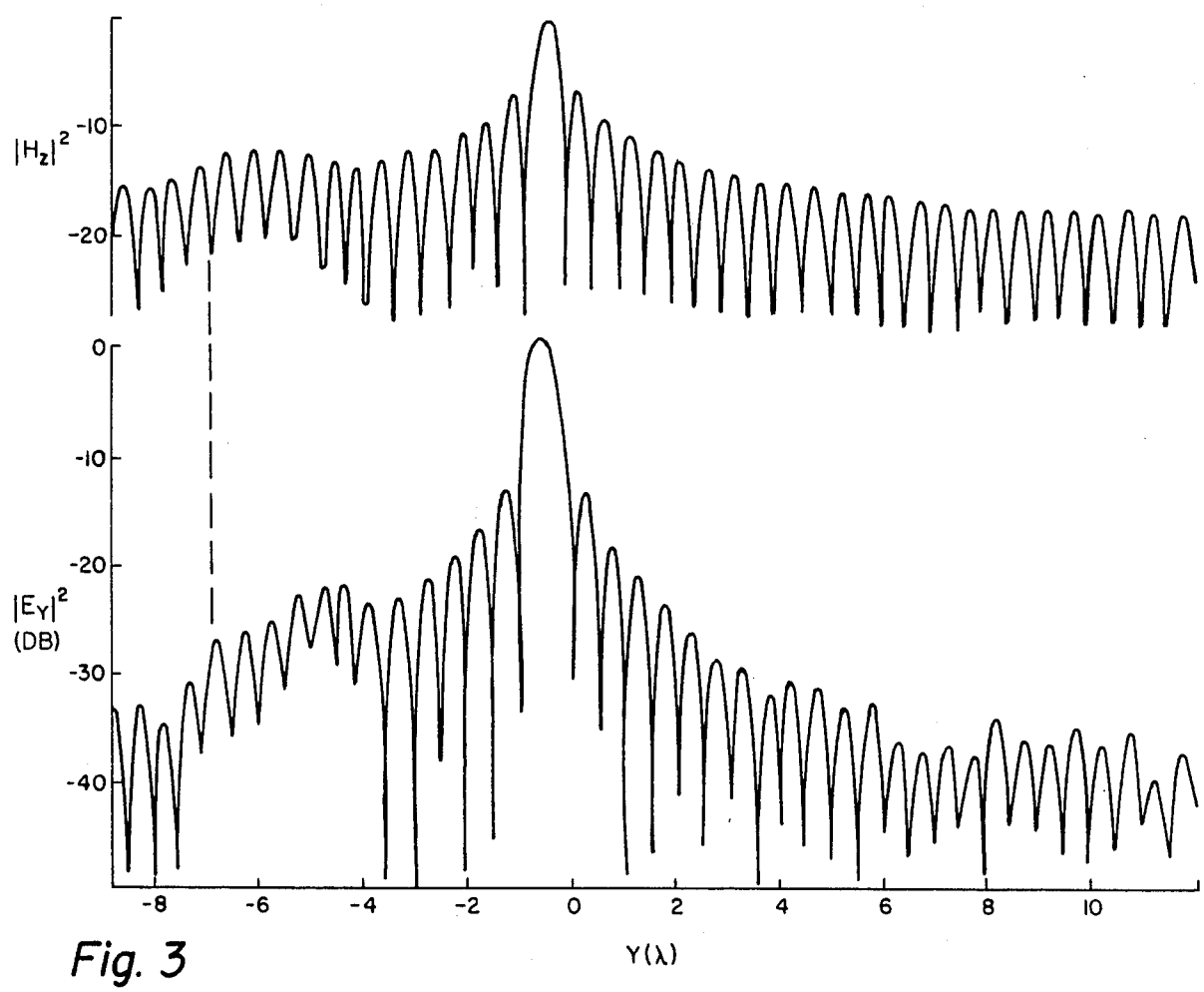
FIG. 3 is a graph of near-fields reconstructed from single arc of measured data.
Figure 4:
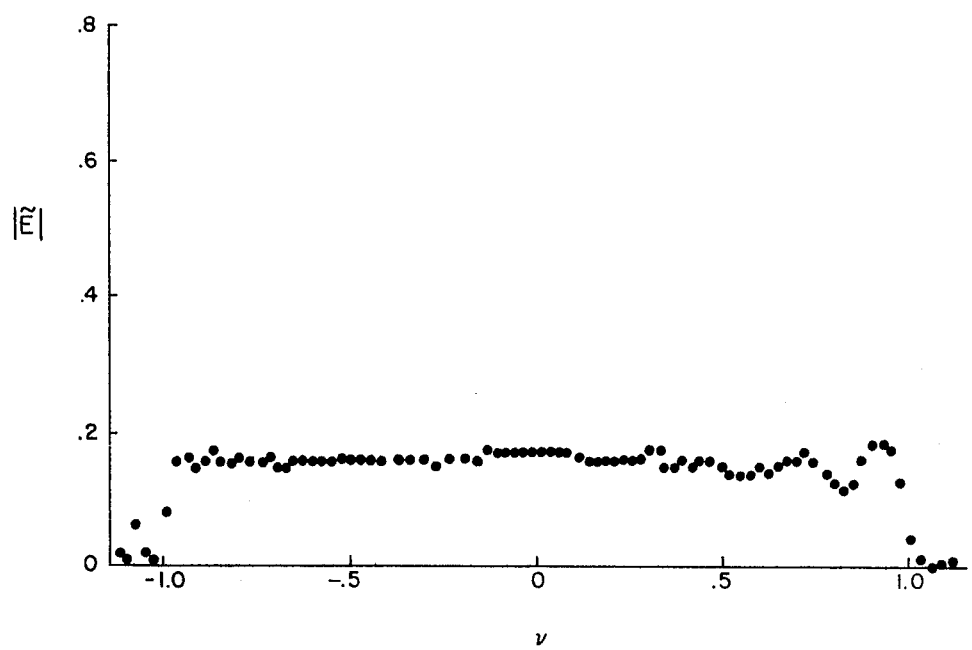
FIG. 4 shows magnitude of electric field spectrum before filtering.

Data were sampled at 4° increments of $\phi_h$ the azimuth angle for the range $-144° \leq \phi_h \leq 100°$, for $\theta h = 90°$. FIG. 3 shows values of reconstructed intensities $|E_y|^2$ and $|H_z|^2$. Each graph is normalized to its own maximum value; however, the relative values of $E_y$ and $H_z$ should be retained for subsequent computations of far-field patterns. The upper graph in FIG. 3 is identical except for the scale of the figure. The reconstructions were evaluated along the horizontal generator of the cone that bisects the slot. The line of reconstructtions was $0.01\lambda_o$ from the cone.

Figure 5:
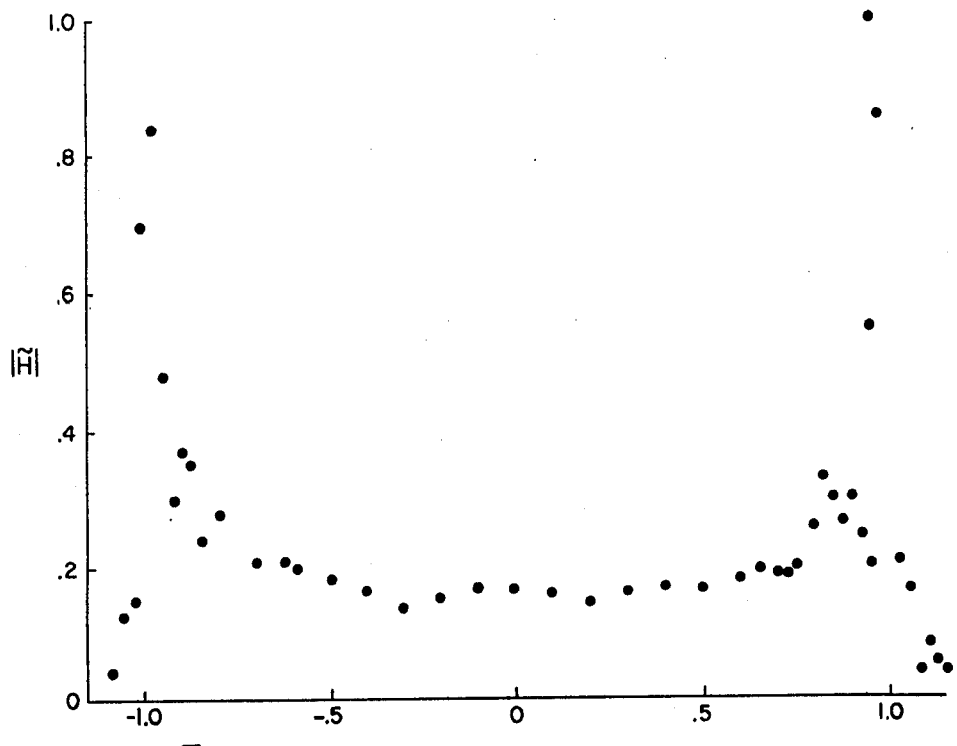
FIG. 5 shows magnitude of magnetic field spectrum before filtering.

Spectra were computed from the complex-valued, reconstructed fields $E_y$ and $H_z$ by the Fourier transform of the reconstructed near-fields as follows.

$$\bar{u}_i = \int \int u_i e^{-i\frac{2\pi}{d_y d_z}(\nu z + \mu y)}$$

where $u_i$ is same as $u_i^*$ with phase reversed, e is the base of the system of natural logarithms, i is $\sqrt{-1}$ and $\nu$ and $\mu$ are the frequency values. FIGS. 2 and 5 show the spectral magnitudes, which are normalized to the largest value of either $|E_y|$ or $|H_z|$. FIG. 5 shows peaks near $|\nu|=1$, but it does not have the singularity predicted for the idealized case of FIG. 6.

Figure 6:
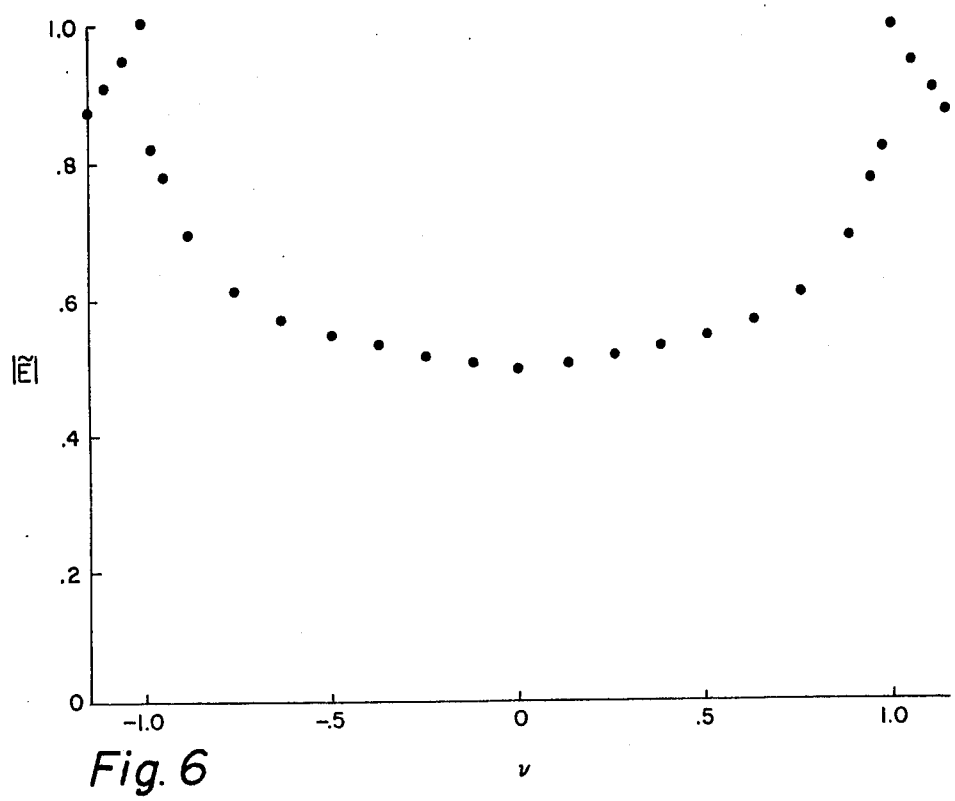
FIG. 6 shows filtered spectral magnitude for uniform farfield, $|\phi_h| < 90°$.
Figure 7:
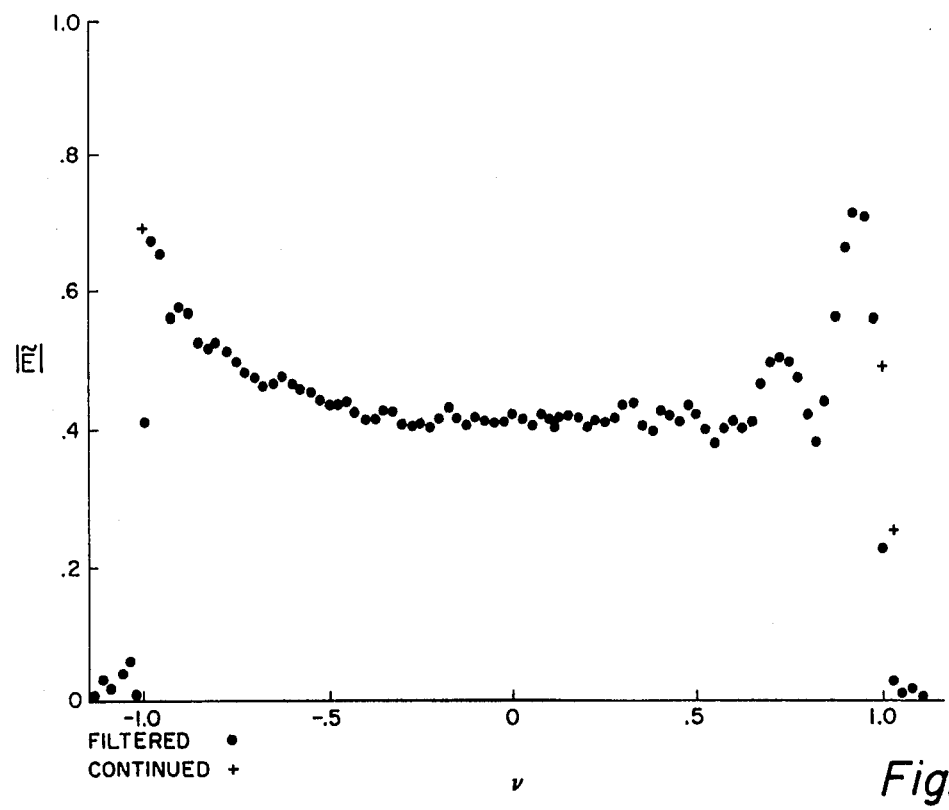
FIG. 7 shows filtered and continued values of E.
Figure 8:
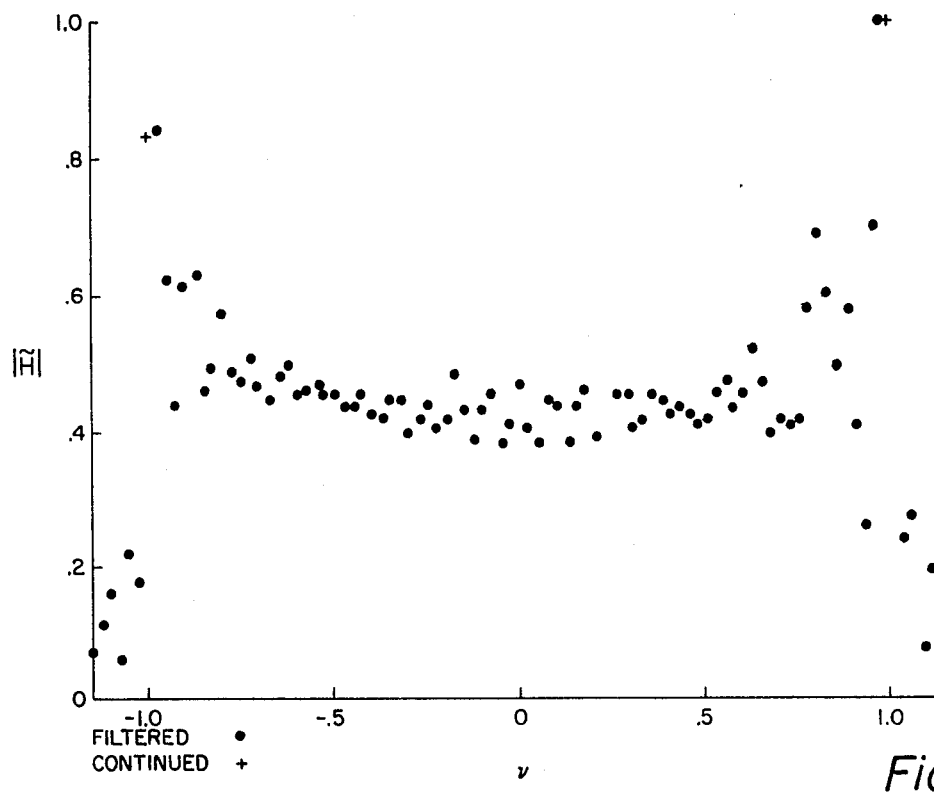
FIG. 8 shows filtered and continued valued of H.
Figure 9:
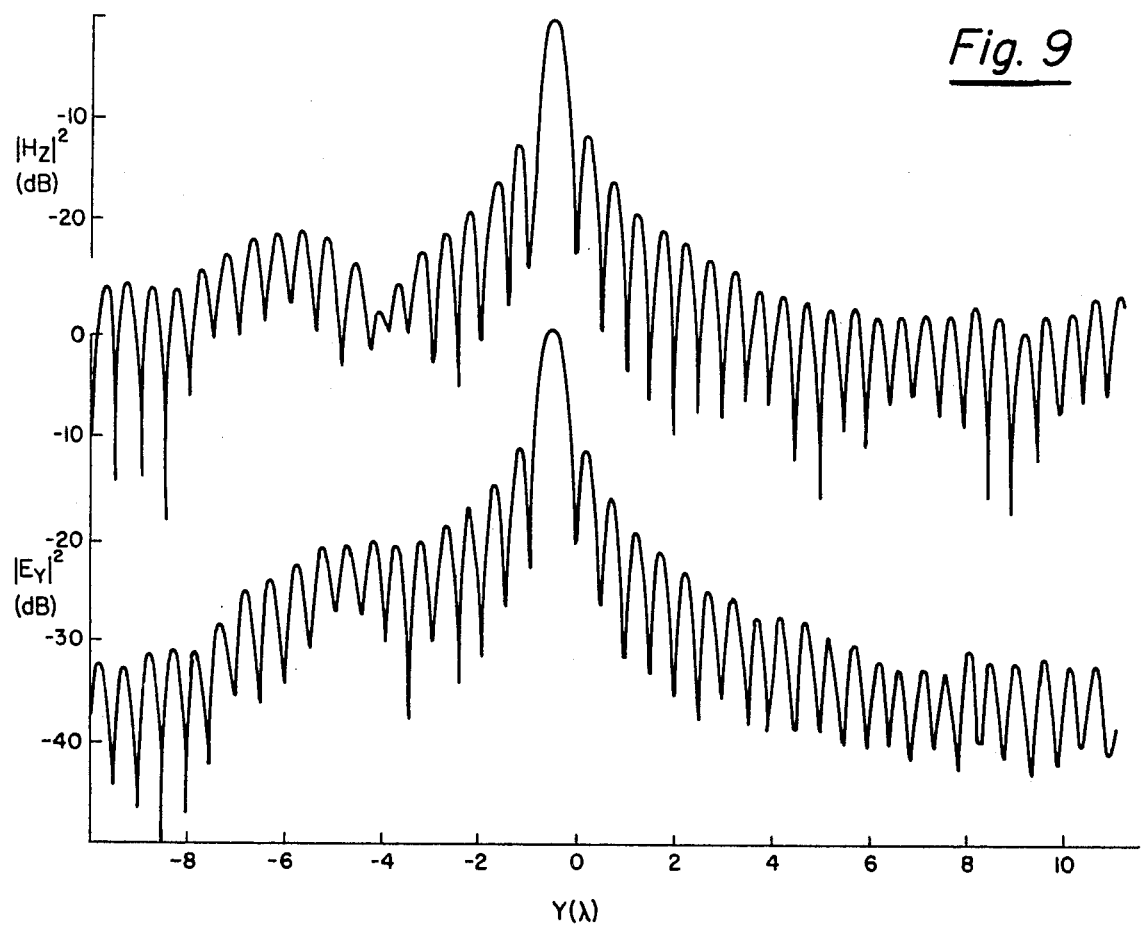
FIG. 9 shows near-fields computed from filtered spectra.
Figure 10:
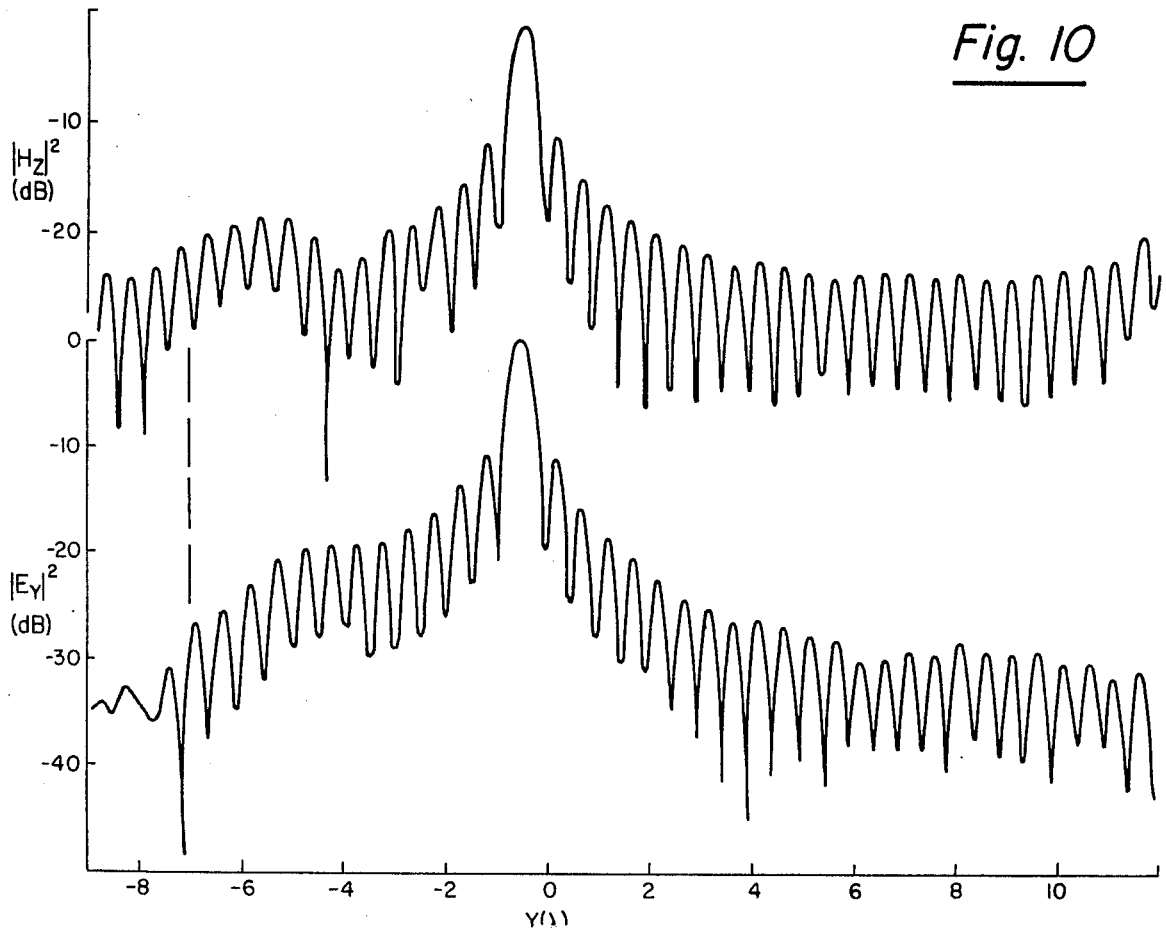
FIG. 10 shows near-fields computed from filtered and continued spectra.

The spectra is filtered by dividing them by a filter function. For the magnetic field, the function $1+(1-\nu^2)^{\frac{1}{2}}$ is used and for the electric field, the function $1+(1-\nu^2)^{\frac{1}{2}}$ is used. FIG. 6 shows a theoretical spectrum for the far-field of an assumed, uniform far-field distribution which corresponds to a very thin slit antenna. The spectrum of FIG. 6 is obtained by measuring the field near a defracting slit aperture which is illuminated by a plane wave. The spectral magnitude in FIG. 6 is an idealization and is used as a reference. FIGS. 7 and 8 show the spectra following division; these spectra more nearly resemble the ideal spectrum in FIG. 6. The next step is to analytically continue the spectra to make it more nearly like that in FIG. 6. As used herein, analytic continuation is as defined in "The International Dictionary of Physics and Electronics." By inverse Fourier transformation of the filtered and continued spectra, with the transform inverse to Equation (2) the near-fields of FIG. 9 are obtained. FIGS. 7 and 8 show some of the spectral values changed near $\nu=1$. When these continued spectra are transformed we obtain the reconstructed near-fields in FIG. 10.

Figure 11:
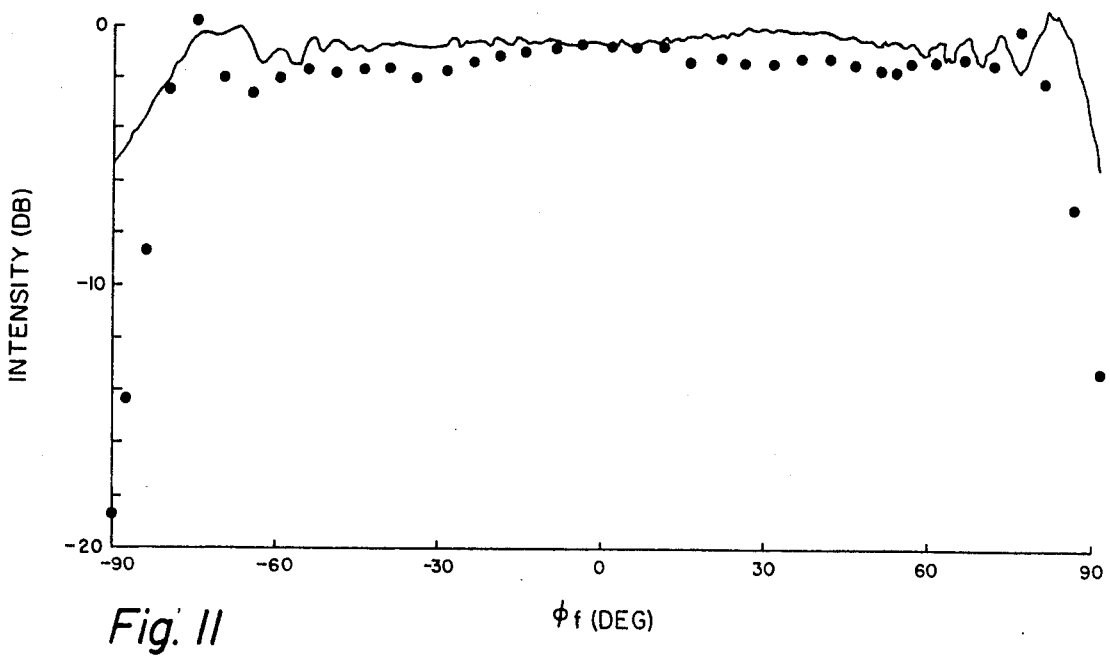
FIG. 11 shows measured and computed far-field E-plane patterns for slot in cone.
Figure 12:
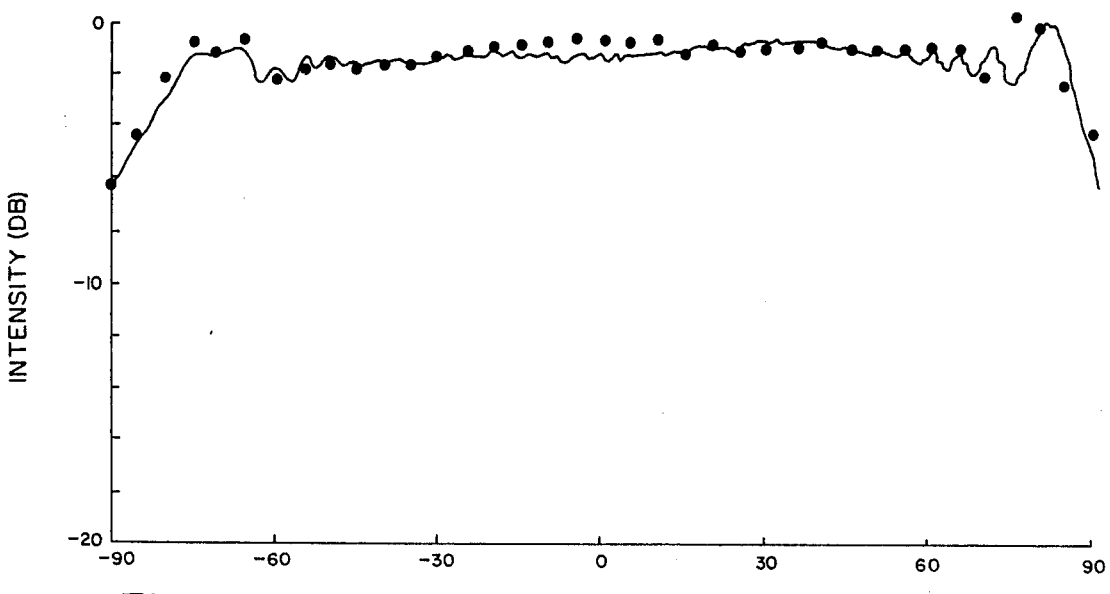
FIG. 12 shows far-field patterns from filtered and continued near-fields.

The benefits of the processing are to increase accuracy of the near-field. The evidence is demonstrated by somewhat better accuracy in far-field patterns, which are determined by the near-fields. The method is desired because direct near-field measurements with a probe at the tested antenna would distort the near-field. FIG. 11 shows a measured far-field pattern and the far-field computed with the original reconstructed near-field that was neither continued nor filtered. FIG. 12 shows the same measured far-field but the computed pattern was formed from filtered and continued near-field data. It is clear that processing improves accuracy of the far-field and hence the near-field.

Obviously, many other modifications and variations of the present invention are possible in the light of the above teachings. It is therefore to be understood that within the scope of the appended claims the invention may be practiced otherwise than as specifically described.

What is claimed is:

1. The method for determining the field distribution at any point about a radiating antenna from measurements on a spherical surface comprising:

radiating a signal from a transmitting antenna to be measured;

receiving the radiated signal at a preselected range defining a spherical surface about the radiating antenna;

measuring the phase and intensity of the received signal;

reconstructing the near-field of the radiating antenna using the conjugate of the measured phase and intensity of said received signal by computing the field at any point within the measurement sphere, including the radiating aperture according to the equation, $$u_i{}^* = \int \left( u_h{}^* \frac{\partial g}{\partial n} - g \frac{\partial u_h{}^*}{\partial n} \right) dS,;$$

determining the spectrum of the reconstructed near-field within the measurement sphere by Fourier transformation according to the equation, $$u_i = \int \int u_i{}^* e^{-i\frac{2\pi}{d_y d_z}(\nu z + \mu y)};$$

filtering said spectrum by multiplying with filter functions, $1+(1-V^2)^{-\frac{1}{2}}$ and $1+(1-V^2)^{\frac{1}{2}}$, to enhance its accuracy;

analytically continuing said filtered spectra by extending the spectra beyond the conventional limit of $1/\lambda$, where $\lambda$ is the wavelength to further enhance its accuracy; and computing the fields within the measurement surface including the field at the radiating antenna aperture by inverse Fourier transformation of said filtered and continued spectra according to the inverse of equation, $$u_i = \int \int u_i{}^* e^{-i\frac{2\pi}{d_y d_z}(\nu z + \mu y)}$$

to provide accurate near-field data which may be used to calculate accurate far-fields of said radiating source.

2. The method of claim 1 wherein computation of far-field antenna patterns outside the measurement circle using the processed fields and aperture distributions is by Fourier transformation.

3. The method of claim 1 wherein said measuring step includes:

rotating said transmitting antenna about a vertical axis;

successively positioning a probe for receiving said transmitted energy on an arc of a circle that lies in a vertical plane and is centered at the radiating antenna; and measuring the phase and intensity of the received radiated signal at the successive positions.

4. The method of claim 3 wherein the measured data of at least two positions of said probe is utilized to determine the complex vector orientation of the field.

* * * * *